United States Patent [19]

Kondo

[11] Patent Number: 5,004,919

[45] Date of Patent: Apr. 2, 1991

[54] TRANSMISSION ELECTRON MICROSCOPE

[75] Inventor: Yukihito Kondo, Tokyo, Japan

[73] Assignee: Jeol, Ltd., Tokyo, Japan

[21] Appl. No.: 547,477

[22] Filed: Jul. 2, 1990

[30] Foreign Application Priority Data

| Jul. 5, 1989 | [JP] | Japan | 1-173836 |
| Aug. 11, 1989 | [JP] | Japan | 1-208185 |
| Aug. 11, 1989 | [JP] | Japan | 1-208186 |
| Oct. 4, 1989 | [JP] | Japan | 1-259495 |

[51] Int. Cl.$^5$ .............................. H01J 37/26
[52] U.S. Cl. ..................... 250/311; 250/306; 250/310
[58] Field of Search ................ 250/311, 306, 307, 310

[56] References Cited

U.S. PATENT DOCUMENTS 2,440,640  4/1948  Marton ............................... 250/306
4,096,386  6/1978  Rempfr et al. ...................... 250/306

OTHER PUBLICATIONS

"An Analytical Reflection and Emission UHV Surface Electron Microscope", W. Telieps and E. Bauer, *Ultramicroscopy*, vol. 17, pp. 57–66, 1985.

Primary Examiner—Jack I. Berman
Attorney, Agent, or Firm—Webb, Burden, Ziesenheim & Webb

[57] ABSTRACT

A transmission electron microscope capable of operating in photoelectron emission microscopy mode as well as in transmission electron microscopy mode. A negative voltage is applied to a specimen placed between the magnetic pole pieces of the objective lens. In the photoelectron emission microscopy mode, the specimen is irradiated with exciting rays to induce photoelectrons from the rear surface of the specimen. The exciting rays can be soft x-rays or ultraviolet rays produced from a high-pressure mercury lamp. The soft x-rays can be produced by directing the electron beam emitted from the electron gun of the microscope either onto the specimen or onto one or more targets placed over the specimen.

12 Claims, 6 Drawing Sheets

TRANSMISSION ELECTRON MICROSCOPE

FIELD OF THE INVENTION

The present invention relates to a transmission electron microscope permitting one to observe a photoelectron image.

BACKGROUND OF THE INVENTION

In transmission electron microscopy, the surface of a specimen is observed or analyzed by reflection electron microscopy or other method. When this reflection electron microscopy is utilized, the structure or topography of a specimen surface can be observed at a resolution of the order of 10 Å. However, it is impossible to know the chemical composition or chemical bonding energy of the specimen surface. Accordingly, when it is desired to know the chemical composition or chemical bonding energies in the specimen surface, photoelectron emission microscopy (PEEM) is a useful means, as described in "An Analytical Reflection and Emission UHV Surface Electron Microscope" by W. Telieps and E. Bauer, *Ultramicroscopy*, Vol. 17, pp. 57-66, 1985.

In a photoelectron microscope for carrying out the photoelectron emission microscopy, a high voltage of the order of several tens of kilovolts (KV) is applied between a specimen and an electrode mounted close to the specimen to create an electric field lens. This lens focuses a photoelectron image onto a fluorescent screen through image forming lenses. This image is created by the photoelectrons emitted from the specimen.

Since the two-dimensional distribution of the chemical composition and the chemical bonding energy of a specimen surface should be known as well as the structure or topography, both a transmission electron microscope and a photoelectron microscope have been required in the past. In this case, if the specimen is observed on one microscope, the specimen must be shifted from one microscope to the other. For this purpose, the specimen must be installed on the sample holder of the other microscope. In this way, quite laborious steps have been needed.

When a crystal of a specimen is grown and the specimen changes are observed, the observation is made while evaporating a substance onto the specimen. In the prior art transmission electron microscope, the substance is deposited on the surface of the specimen which faces the electron gun. Therefore, the evaporation source is located above the specimen. This makes it impossible to use a boat heater, crucible, or the like as the vapor source. Thus, the vapor source consists of a wire heater on which the metal to be vaporized is wound. With this type of vapor source, only a very small amount of metal can be evaporated in one operation. Consequently, it is difficult to observe the specimen while depositing a metal onto the specimen for an extended period of time. Another problem arises from the fact that the aforementioned wire heater is often made of a metal. Specifically, it is impossible to employ an evaporating substance which can easily combine with the material of the heater. Hence, great limitations are imposed on the evaporating substance.

SUMMARY OF THE INVENTION

In view of the foregoing problems, it is an object of the present invention to provide a transmission electron microscope permitting one to observe a photoelectron image.

It is another object of the invention to provide a transmission electron microscope permitting one to observe both a photoelectron image and a transmission electron image without the need to move the specimen onto a different microscope.

It is a further object of the invention to provide a transmission electron microscope which permits one to observe a specimen while evaporating a substance onto the specimen for an extended period of time and which places no limitations on the evaporated substance.

These objects are achieved in accordance with the teachings of this invention by a transmission electron microscope comprising: an electron gun producing an electron beam; a condenser lens system which focuses the electron beam onto a specimen; an imaging lens system consisting of an objective lens, an intermediate lens, and a projector lens; a display means upon which an image created by the electrons emitted from the specimen is displayed; a voltage-applying means for applying a negative voltage to the specimen placed between the magnetic pole pieces of the objective lens; and an exciting ray-irradiating means which irradiates the specimen with exciting rays to induce photoelectrons from the rear surface of the specimen, the photoelectrons being imaged by the imaging lens system.

Other objects and features of the invention will appear in the course of the description thereof which follows.

DETAILED DESCRIPTION OF THE INVENTION

Figure 1:
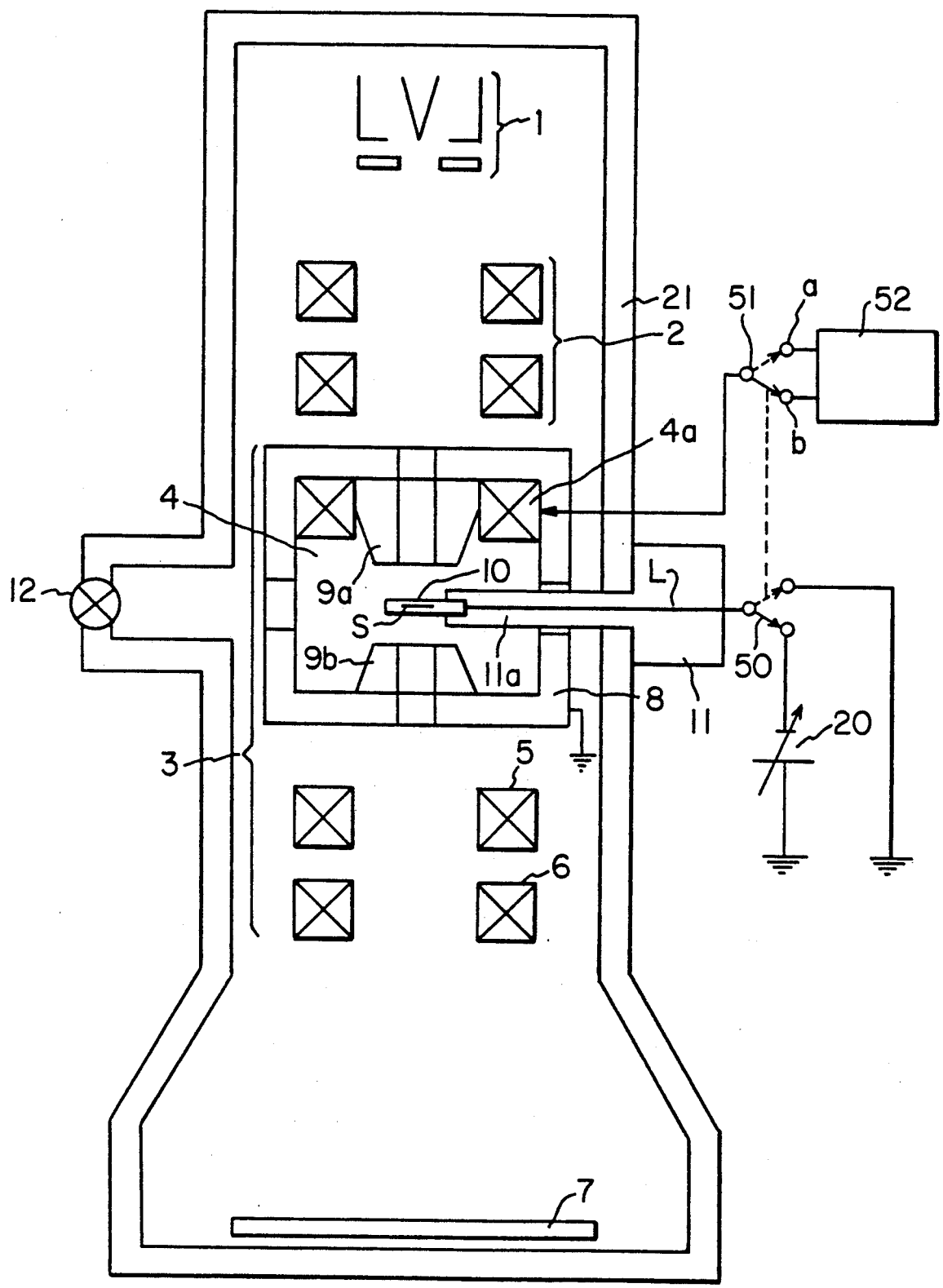
FIG. 1 is a schematic diagram of a transmission electron microscope according to the present invention.

Referring to FIG. 1 there is shown a transmission electron microscope embodying the concept of the invention. This microscope includes an electron gun 1, a condenser lens system 2, an imaging lens system 3, and a fluorescent screen 7. The imaging lens system 3 consists of an objective lens 4, an intermediate lens 5, and a projector lens 6. The objective lens 4 is composed of a lens coil 4a, a yoke 8, an upper magnetic pole piece 9a, and a lower magnetic pole piece 9b. A specimen S is held by a specimen holder 10 which is placed inside the objective lens 4. The holder 10 is introduced into the objective lens 4 through a partition valve 12 by a specimen introduction rod (not shown).

The specimen holder 10 is mounted on a specimen drive mechanism 11 having a driving shaft 11a. A high-voltage electrical line L is inserted in the shaft 11a to apply a voltage to the specimen S. The line L is electrically insulated from both the envelope of the microscope and the yoke by insulators or the like. The high-voltage line L is connected with a selector switch 50 to connect the line L either with a high voltage source 20 or with the ground. When the microscope operates in photoelectron emission microscopy mode to observe a photoelectron image, the voltage source 20 impresses a high negative voltage of the order of tens of kilovolts to the specimen. The objective lens 4 is excited with electrical current supplied from an excitation power supply 52 having terminals a and b. Depending on whether the instrument operates in the transmission electron microscopy mode or in the photoelectron emission microscopy mode, a different exciting current is delivered from terminal a or b of the power supply 52. The lens coil 4a is connected either with the terminal a or b of the power supply 52 by a selector switch 51. When the selector switch 50 is switched to its different position, the output from the power supply 52 is automatically switched to the other level. The microscope column of the microscope is indicated by 21.

The operation of the instrument is now described. Where the specimen S is silicon (Si), aluminum (Al), magnesium (Mg), or other similar substance, the energy of the characteristic x-rays emitted from the specimen are adequate to induce photoemission. In order to observe an image created by the produced photoelectrons, the switch 50 is first connected with the high voltage source 20 to apply the high negative voltage to the specimen S. The switch 51 is automatically switched to the terminal b of the power supply 52 to excite the coil 4a with the exciting current from the power supply 52, for observing the photoelectron image. The amplitude of the exciting current has been previously determined, taking account of the energy of the photoelectrons emitted according to the voltage applied to the specimen, as well as the action of the electrostatic lens created between the specimen and the magnetic pole piece 9b.

Figure 2:
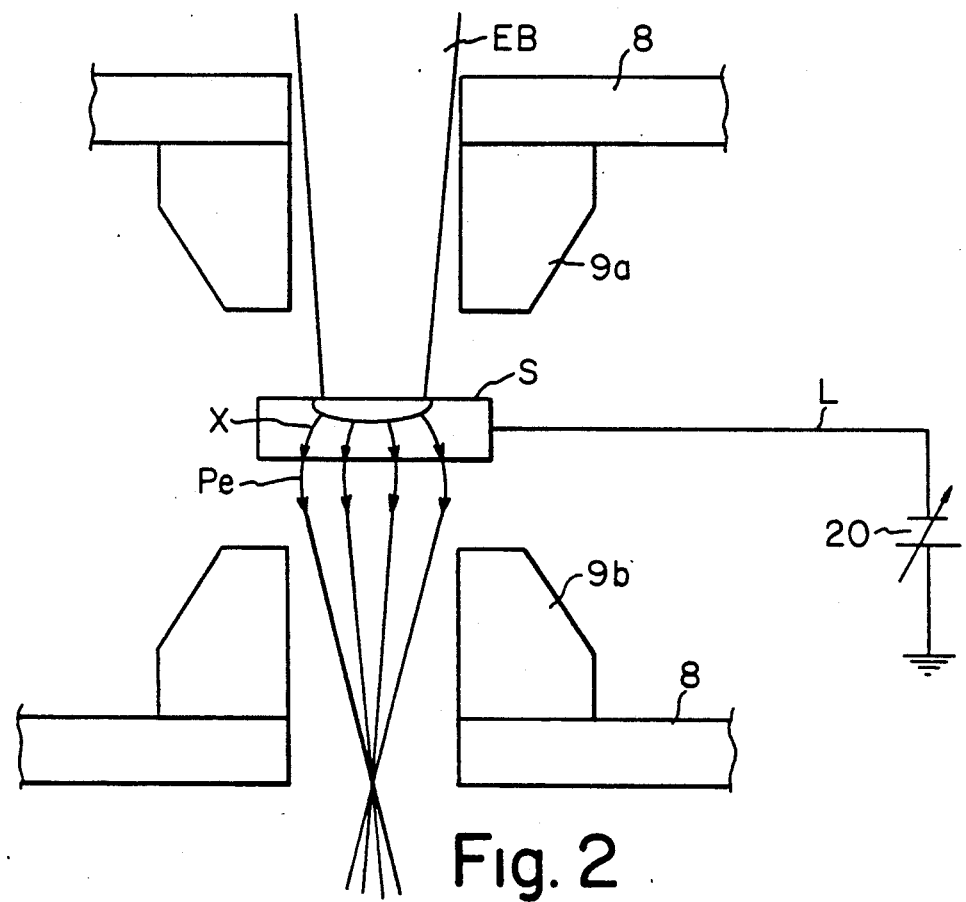
FIG. 2 is a fragmentary enlarged view of the microscope shown in FIG. 1, for illustrating the operation of the microscope.

Referring next to the enlarged view of FIG. 2, the electron beam EB emitted from the electron gun is caused to hit the upper surface of the specimen S after focused to a desired diameter by the condenser lens system 2. It is to be noted that the selector switches 50, 51, the excitation power supply 52, and other components are omitted in FIG. 2 and the following Figures. When the electron beam EB strikes the specimen S, the atoms existing in the incident surface are excited by the incident electrons. As a result, the specimen S emits characteristic x-rays in the soft x-ray range. Since the incident electron beam is absorbed by the specimen to a much greater extent than the characteristic x-rays, if a specimen of an appropriate thickness is used, then the amount of the electrons penetrating beyond the lower surface of the specimen can be made negligibly small. The x-rays penetrating through the specimen is comparable in magnitude with the x-rays ordinarily used in x-ray photoelectron spectroscopy. The "lower surface" of the specimen means the surface of the specimen opposite to the surface on which the electron beam EB impinges. The x-rays diffused through the specimen excites the atoms of the specimen, thus giving rise to photoelectrons Pe from the lower surface of the specimen. The photoelectrons Pe are accelerated by the electric field set up between the specimen S and the lower magnetic pole piece 9b. Then, the electrons are converged by the objective lens 4 to create an image of the specimen. The photoelectron image is magnified and focused onto the fluorescent screen 7 by the intermediate lens 5 and the projector lens 6. If a magnetic field is used together with the electric field, a lens having small aberrations can be obtained. Therefore, the photoelectron image can be observed at high resolution.

When the selector switch 50 is switched to the ground, an exciting current is supplied to the coil 4a from the exciting power supply 52 to operate the instrument in the transmission electron microscopy mode. At this time, an ordinary transmission electron micrograph is displayed on the screen 7.

Figures 3A, 3B:
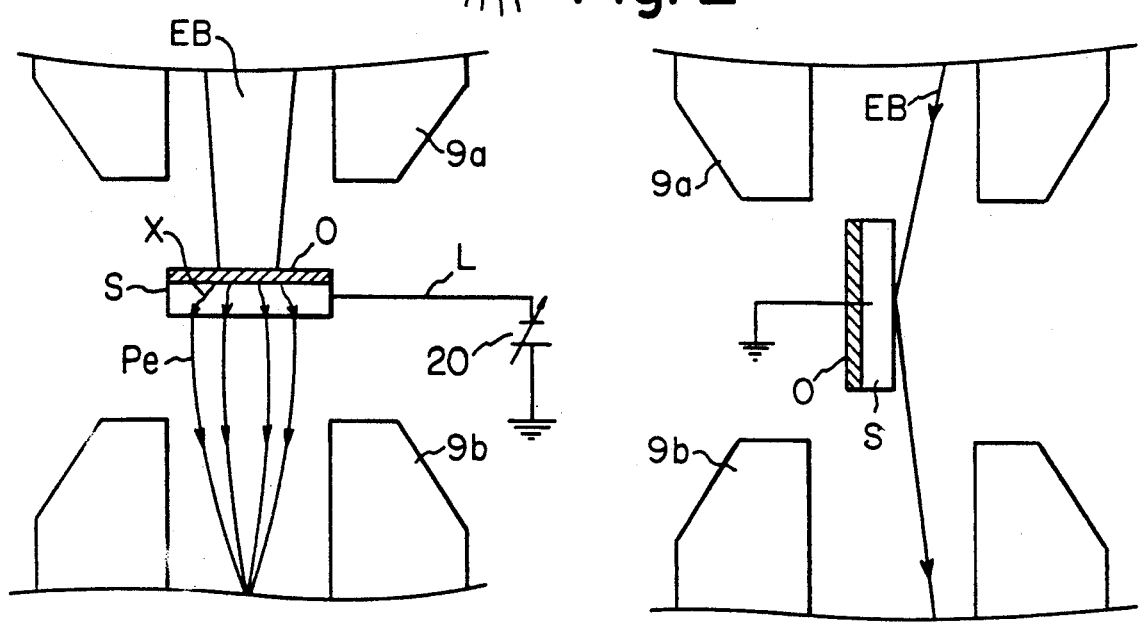
FIG. 3(a) is a view similar to FIG. 2, but showing another transmission electron microscope according to the invention, and in which the microscope operates in the photoelectron emission microscopy mode.
FIG. 3(b) is a fragmentary view of the microscope shown in FIG. 3(a), for illustrating observation of a reflection electron image.

In this way, the novel transmission electron microscope can offer a photoelectron micrograph, as well as a transmission electron micrograph. The instrument can be switched between the transmission electron microscopy mode and the photoelectron emission microscopy mode simply by operating the selector switch without the need to move the specimen between two different microscopes. Hence, the apparatus is quite easy to operate.

Where the nature of the specimen is such that it does not produce soft x-rays, a target 0 consisting of a substance emitting soft x-rays is mechanically attached to one side of the specimen S or formed on one side of the specimen by evaporation or other thin film preparation techniques, as shown in FIG. 3(a). The target 0 is irradiated with the electron beam EB to produce soft x-rays which excite the atoms of the specimen. Then, photoelectrons Pe are emitted from the lower surface of the specimen. As a result, a photoelectron image is presented on the fluorescent screen 7.

Where the target material is coated on the upper surface or one side of the specimen by evaporation or other method, the evaporation is performed inside the objective lens or the pretreatment chamber (not shown) after the observation of a transmission electron micrograph. Subsequently, a photoelectron micrograph can be observed.

Where the specimen surface is to be observed by reflection electron diffraction, the specimen S is maintained at ground potential and rotated through approximately 90°, as shown in FIG. 3(b), before the specimen is irradiated with the electron beam.

Figure 4:
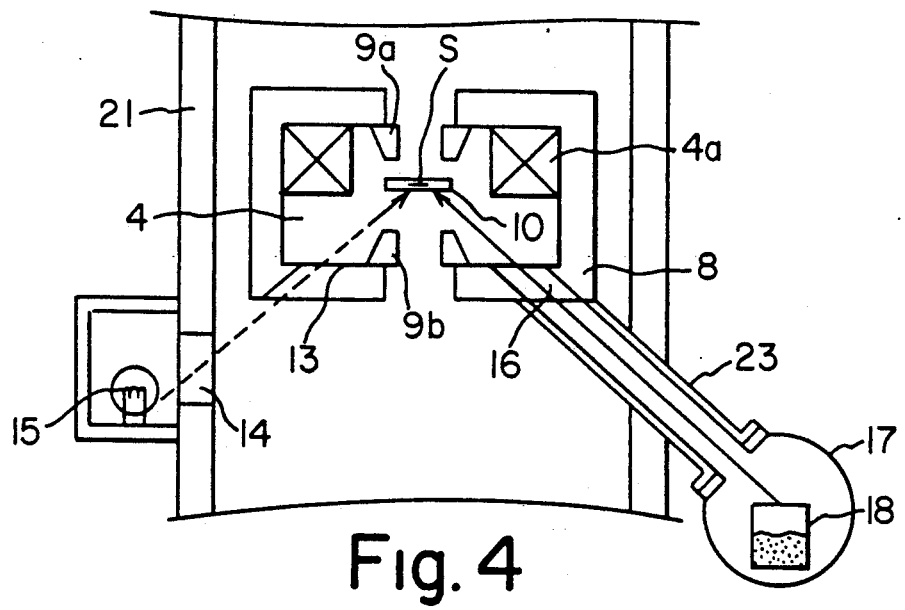
FIGS. 4, 5, 6, 7, 8, and 9 are schematic diagrams of other transmission electron microscopes according to the invention.

Referring next to FIG. 4, there is shown another transmission electron microscope according to the invention. This microscope is similar to the microscope already described in connection with FIG. 1 except for the following. The coil 4a is wound around the upper portion of the yoke. The center of the coil 4a is located over the specimen S. The lower portion of the yoke is provided with a hole 13 to permit incidence of exciting rays. The microscope column 21 is provided with a window 14 which maintains the vacuum. An ultraviolet light source 15 is disposed close to the window 14 outside the microscope column 21 in such a way that ultraviolet rays emitted from the light source 15 and acting as exciting rays pass through the window 14 and the hole 13 and impinge on the specimen S from below it. A high-pressure mercury lamp is used as the ultraviolet light source 15.

The lower portion of the yoke is formed with another hole 16 to enable passage of vapor. A chamber 17 is connected to the hole 16 via an introduction tube 23. A crucible 18 containing a vapor source is placed in the chamber 17.

In the operation of the microscope of this construction, ultraviolet rays from the light source 15 hit the lower surface of the specimen S, so that photoelectrons are emitted from the lower surface of the specimen S.

Thus, a photoelectron micrograph can be observed in the same way as in the above-described example. Where the growth process of a crystal of the vapor material on specimen S is to be observed with a photoelectron micrograph, the vapor is deposited onto the specimen from the vapor source in the crucible 18. In this example, the vapor source can be disposed below the specimen, which permits the use of the crucible 18. Hence, a large amount of evaporating substance can be contained in the crucible. The specimen can be observed while depositing the vapor onto the specimen over an extended period of time. Also, no limitations are imposed on the evaporation of a reactive substance, such as gallium (Ga) or arsenic (As), onto the specimen. The amount of evaporation can be controlled by inserting a shutter or other shield between the vapor source and the specimen. An ion source or a sputtering source may be installed instead of the vapor source. In this case, an ion beam hits the specimen from below it to observe the specimen while etching it.

Figure 5:
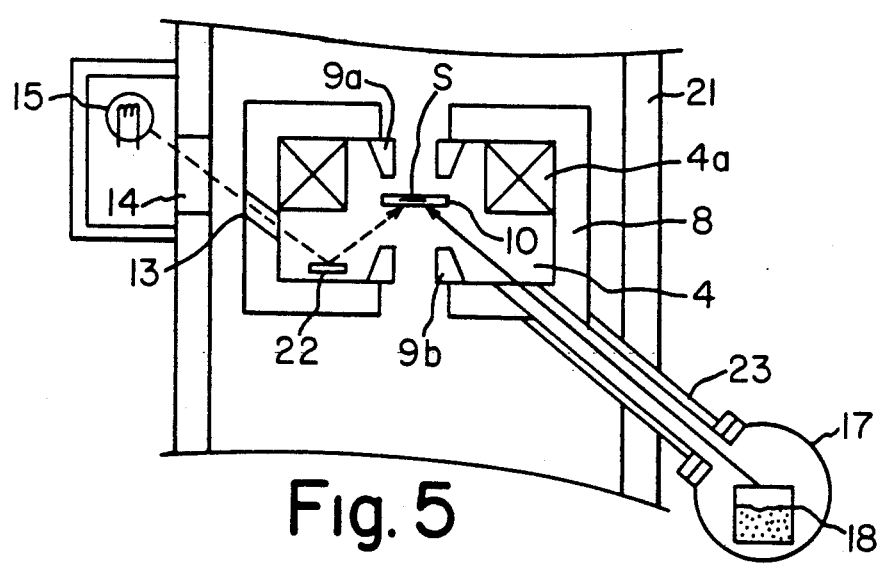

Referring to FIG. 5, there is shown a further transmission electron microscope according to the invention. This microscope is similar to the microscope described in conjunction with FIG. 4 except that a reflector 22 is mounted inside the objective lens 4. Ultraviolet rays pass through the hole 13 and enter the objective lens 4. Then, the rays are reflected by the reflector 22 and hit the lower surface of the specimen S to form a photoelectron image.

Figure 6:
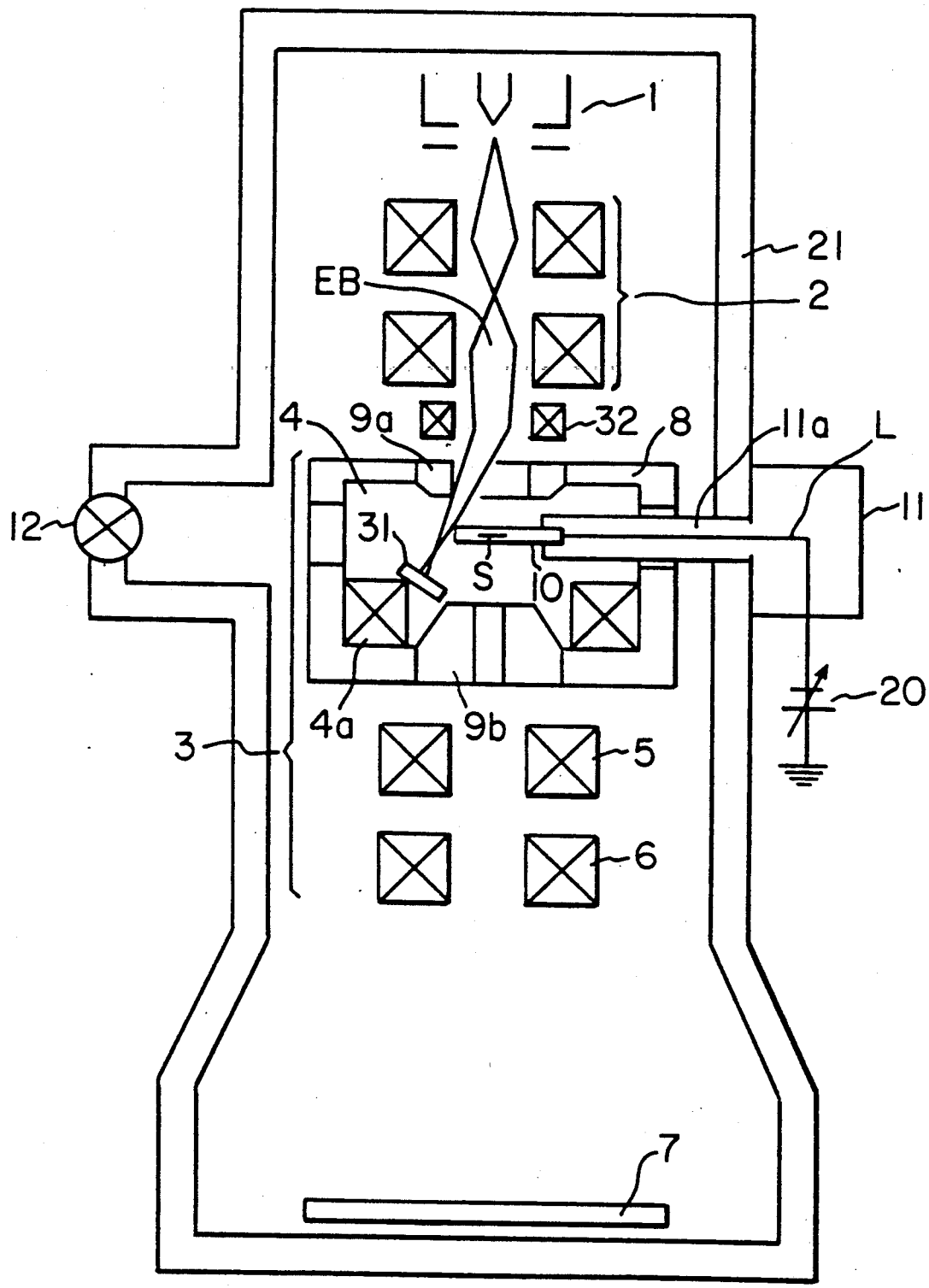

Referring to FIG. 6, there is shown still another transmission electron microscope according to the invention. This microscope is similar to the microscope shown in FIG. 1 except that an x-ray generating target 31 is installed below the specimen S inside the objective lens 4 and that an electron deflector 32 is mounted between the condenser lens system 2 and the objective lens 4. The deflector 32 deflects the electron beam EB away from the specimen S onto the target 31.

In the operation of the microscope of this construction, when a photoelectron micrograph should be observed, a voltage is applied to the specimen S. At the same time, the deflector 32 deflects the electron beam EB away from the specimen S onto the target 31. The amplitude of the signal driving the deflector 32 has been previously determined, taking account of the action of deflection of the high voltage applied to the specimen S and the action of deflection of the objective lens 4. When the electron beam impinges on the target 31, it produces characteristic x-rays which are directed onto the lower surface of the specimen S. Thus, photoelectrons are released from the lower surface of the specimen. As a result, a magnified photoelectron image of the specimen is projected onto the screen 7.

In this configuration, if a separate x-ray source is mounted, i.e., the specimen itself is not used as an x-ray source, nor is any target installed on the specimen, then it is not necessary to install the x-ray source outside the objective lens. This makes it unnecessary to form a hole in the yoke which would otherwise permit incidence of the x-rays from the external x-ray source. Consequently, the objective lens can be made small. Also, the distance between the upper magnetic pole piece and the lower magnetic pole piece of the objective lens can be reduced to thereby decrease the aberrations of the objective lens. Hence, an image can be derived with high resolution.

Figure 7:
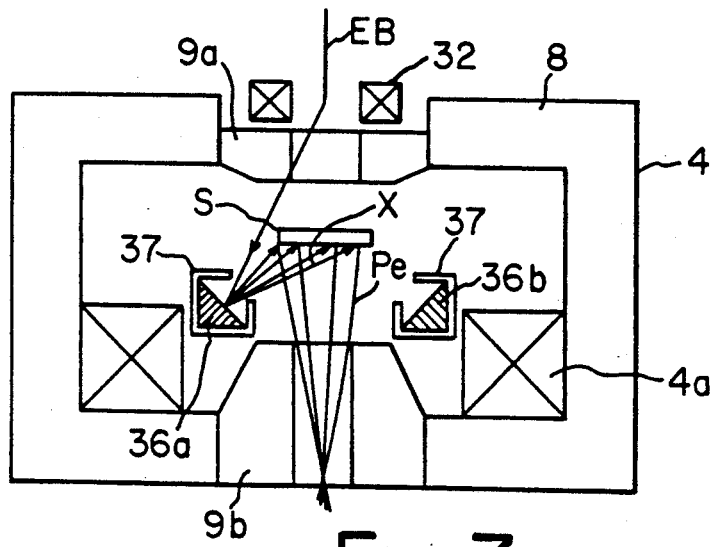

Referring to FIG. 7, there is shown yet another transmission electron microscope according to the invention. X-ray generating targets 36a and 36b made of different materials are disposed below the specimen S inside the objective lens 4. The target 36a is made of silicon, while the target 36b is made of aluminum.

In this configuration, the signal supplied to the deflector 32 is varied so that the target emitting photoelectrons at a higher efficiency may be irradiated with the electron beam EB. That is, the used target is selected according to the properties of the specimen. In this way, whenever a photoelectron micrograph of the specimen is observed, a sufficient amount of photoelectrons can be produced, irrespective of changes in the specimen.

When the electron beam is caused to impinge on the selected target, x-rays (denoted by x) are produced from the surface of the target. Further, reflection electrons are emitted. In this example, therefore, the x-ray generating targets 36a and 36b are surrounded with a shield 37 except for the passage of the electron beam and for the passage of the x-rays to prevent the reflected electrons from hitting the specimen. Instead of surrounding the targets with the shield, a high voltage sufficient to overcome the energy of the reflected electrons may be applied to the specimen.

Figure 8:
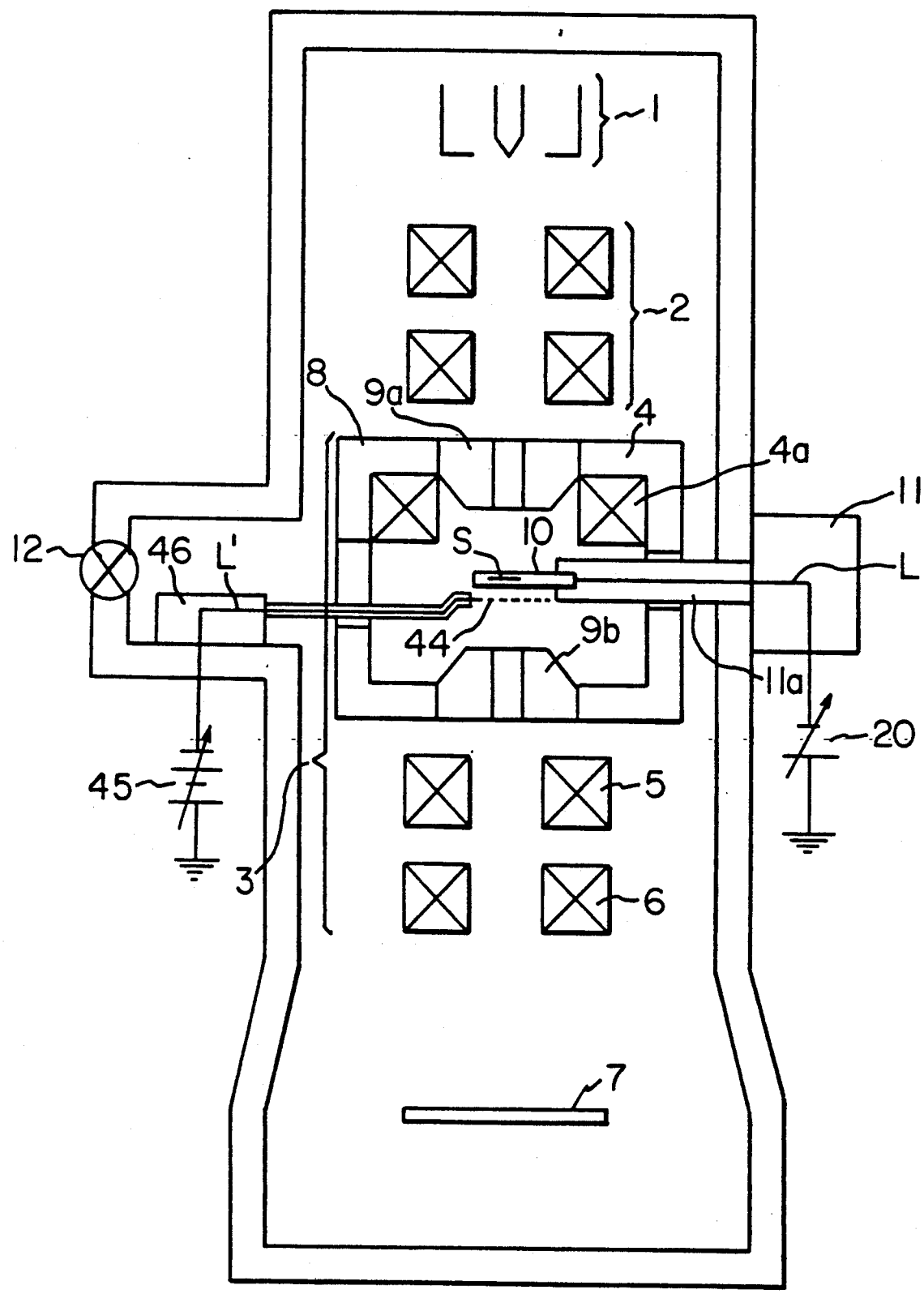

Referring to FIG. 8, there is shown yet another transmission electron microscope according to the invention. This microscope is similar to the microscope shown in FIG. 6 except that a grid electrode 44, a high voltage source 45, and a mechanism 46 for moving the grid electrode 44 away from the optical axis are added. The grid electrode 44 is disposed close to the lower surface of the specimen S. The voltage source 45 is connected with the grid electrode 44 via an electrical wire L'. The power supply 45 applies a lower negative voltage to the grid electrode 44 than the voltage applied to the specimen. The grid electrode 44 may be replaced by a stop or diaphragm to which a lower voltage is applied than the voltage applied to the specimen.

In this structure, the specimen S is irradiated with the electron beam EB to produce x-rays which induce photoelectrons from the lower surface of the specimen S. The released photoelectrons posses certain energies. Where the chemical composition or chemical bonding energies should be elucidated by photoelectron emission microscopy, it is also necessary to analyze the energy levels of the released photoelectrons. For this purpose, the grid electrode 44 is used. By adequately setting the voltage applied to the grid electrode 44, those of the photoelectrons released from the specimen S which have energies insufficient to overcome the voltage applied between the grid electrode 44 and the specimen are returned to the specimen by the electric field produced between the specimen S and the grid electrode 44. Meanwhile, the photoelectrons having higher energies pass through the grid electrode 44 and form an image on the screen 7.

When a transmission electron micrograph is observed, the specimen S is placed at ground potential. The drive mechanism 46 is operated to move the grid electrode 44 away from the optical axis. Thus, a transmission electron micrograph is displayed on the screen 7.

Figure 9:
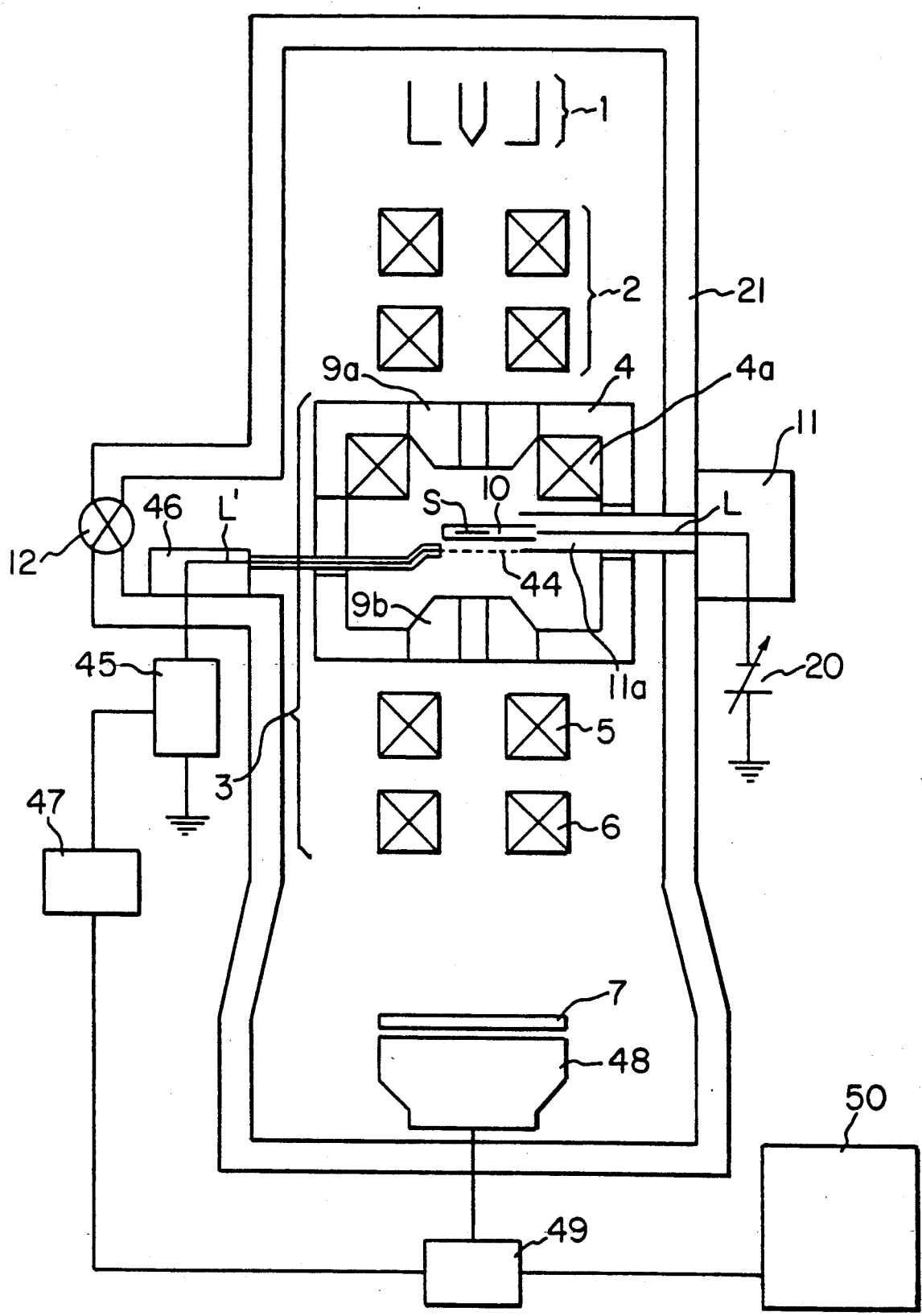

Referring to FIG. 9, there is shown still a further transmission electron microscope according to the invention. This microscope is similar to the microscope shown in FIG. 8 except that an image sensor 48 such as a camera tube, a modulator circuit 47, a lock-in amplifier 49, and a display device 50 are added. The image sensor 48 which is disposed behind the fluorescent screen 7 converts the optical image of the specimen into an electrical signal. The modulator circuit 47 is connected with the high-voltage source 45 and also with the amplifier 49. The modulator circuit 47 acts to modulate the voltage applied to the grid electrode 44. The lock-in amplifier 49 receives the output signal from the modulator circuit 47 as a reference signal. The display device 50 receives the output signal from the amplifier 49 to display the photoelectron image.

In the operation of the microscope of this construction, photoelectrons are released from the lower surface of the specimen by bombardment of the electron beam. Of these photoelectrons, only the photoelectrons which have sufficient energies to pass the electric field between the electrode 44 and the specimen S travel toward the image sensor 48, where they are detected. Since the voltage applied to the electrode 44 is modulated, only the signal components indicating the photoelectrons having energies substantially corresponding to the voltage at the electrode 44 are extracted by the lock-in amplifier 49. The output signal from the amplifier 49 is sent to the display device 50. As a result, an energy-filtered image is displayed on the display device 50, the image being created by the photoelectrons having energies substantially corresponding to the voltage applied to the electrode 44. A charge-coupled image sensor or a microchannel plate may also be used as the image sensor 48.

In the above examples, only the strength of excitation of the objective lens is switched to other value when the operation mode is switched to the transmission electron microscopy mode or the photoelectron emission microscopy mode. The strength of excitation of the other lenses included in the condenser lens system may be switched to other values simultaneously.

Having thus described my invention with the detail and particularity required by the Patent Laws, what is claimed and desired to be protected by Letters Patent is set forth in the following claims.

What is claimed is:

1. A transmission electron microscope comprising:
an electron gun producing an electron beam;
a condenser lens system which focuses the electron beam onto a specimen;
an imaging lens system consisting of an objective lens, an intermediate lens, and a projector lens;
a display means upon which an image created by the electrons emitted from the specimen is displayed;
a voltage-applying means for applying a negative voltage to the specimen placed between the magnetic pole pieces of the objective lens; and
means for irradiating the specimen with exciting rays to induce photoelectrons from the lower surface of the specimen, whereby the photoelectrons emitted from the specimen are imaged by the imaging lens system.

2. The transmission electron microscope of claim 1, further comprising a selector switch for connecting the specimen either with the voltage-applying means or with a ground and a means for switching the exciting current supplied to the imaging lens system to another value when the operation mode of the microscope is switched from a transmission electron microscopy mode to a photoelectron emission microscopy mode or vice versa.

3. The transmission electron microscope of claim 1, wherein said exciting rays are soft x-rays produced by the incidence of the electron beam upon the upper surface of the specimen.

4. The transmission electron microscope of claim 1, wherein said means for irradiating includes a target disposed over the specimen, and wherein said exciting rays are soft x-rays produced from the target by the irradiation of the electron beam.

5. The transmission electron microscope of claim 1, wherein said means for irradiating includes a light source directed toward the lower surface of the specimen, and wherein said exciting rays are the light emitted from the light source.

6. The transmission electron microscope of claim 5, wherein said means for irradiating includes a reflector which reflects said light to the lower surface of the specimen.

7. The transmission electron microscope of claim 1, wherein said means for irradiating includes at least one target that generates x-rays and is mounted below the specimen inside the objective lens and a deflector for directing the electron beam to the target in such a way that the beam is deflected away from the specimen.

8. The transmission electron microscope of claim 7, wherein at least one target comprises plural kinds of targets disposed at different positions inside the objective lens.

9. The transmission electron microscope of claim 1, further comprising an electrode mounted adjacent the underside of the specimen and a means for applying a lower voltage to the specimen than the negative voltage applied to the specimen.

10. The transmission electron microscope of claim 9, further comprising a means for modulating the voltage applied to the electrode; an image sensor which converts the image created by the photoelectrons into an electrical signal; and a means for extracting that component of the electrical signal from the image sensor which is modulated in response to the modulation of the voltage and for supplying the extracted component to the display means.

11. The transmission electron microscope of claim 1, wherein the exciting coil of the objective lens is disposed inside the yoke so constructed and arranged that the center of the coil is located over the specimen, and wherein the yoke of the objective lens is provided with a hole to direct the exciting rays to the lower surface of the specimen from the lower side of the specimen, the hole being located below the specimen.

12. The transmission electron microscope of claim 1, wherein the exciting coil of the objective lens is disposed inside the yoke so constructed and arranged that the center of the exciting coil is located over the specimen, and wherein the yoke of the objective lens is provided with a hole to direct vapor emanating from a vapor source to the lower surface of the specimen from the lower side of the specimen, the vapor source and the hole being located below the specimen.

* * * * *